(12) United States Patent
Drogi et al.

(10) Patent No.: US 8,731,496 B2
(45) Date of Patent: May 20, 2014

(54) POWER AMPLIFIER POWER CONTROLLER

(75) Inventors: Serge Francois Drogi, Flagstaff, AZ (US); Martin Tomasz, San Francisco, CA (US); Vikas Vinayak, Menlo Park, CA (US)

(73) Assignee: Quantance, Inc., San Mateo, CA (US)

( * ) Notice: Subject to any disclaimer, the term of this patent is extended or adjusted under 35 U.S.C. 154(b) by 1144 days.

(21) Appl. No.: 12/642,519

(22) Filed: Dec. 18, 2009

(65) Prior Publication Data

US 2011/0148519 A1 Jun. 23, 2011

(51) Int. Cl.
*H04B 1/04* (2006.01)

(52) U.S. Cl.
USPC ....... 455/127.1; 455/91; 455/107; 455/114.3; 455/126

(58) Field of Classification Search
USPC .................. 455/91, 114.3, 126, 127.1, 127.2, 455/127.3, 107
See application file for complete search history.

(56) References Cited

U.S. PATENT DOCUMENTS

| | | | |
|---|---|---|---|
| 6,304,139 B1 * | 10/2001 | Kanno | 330/133 |
| 6,822,511 B1 | 11/2004 | Doherty et al. | |
| 7,103,329 B1 | 9/2006 | Thon | |
| 7,440,731 B2 | 10/2008 | Staudinger et al. | |
| 2002/0101907 A1 | 8/2002 | Dent et al. | |
| 2004/0198270 A1 | 10/2004 | Rozenblit et al. | |
| 2005/0227640 A1 | 10/2005 | Haque et al. | |
| 2007/0082630 A1 * | 4/2007 | Aridas et al. | 455/127.2 |
| 2007/0184796 A1 | 8/2007 | Drogi et al. | |
| 2008/0261544 A1 | 10/2008 | Blin | |

OTHER PUBLICATIONS

PCT International Search Report and Written Opinion, PCT Application No. PCT/US2010/057673, Jan. 19, 2011, 12 pages.

* cited by examiner

*Primary Examiner* — Tuan Pham
(74) *Attorney, Agent, or Firm* — Fenwick & West LLP

(57) ABSTRACT

A power amplifier power controller in the power amplifier system monitors various operating conditions of the power amplifier, and controls the output transmit power of the power amplifier by coordinated control of both the input drive level to the power amplifier and the gain of the power amplifier. The power amplifier power controller controls the input drive level to the power amplifier so that the input drive level does not change substantially while adjusting the gain of the power amplifier to maximize the transmit power. The power amplifier power controller may also adjust the input drive level by some portion of the overall change required to the power of the power amplifier, while adjusting the gain of the power amplifier by the remaining portion of such overall change.

31 Claims, 3 Drawing Sheets

POWER AMPLIFIER POWER CONTROLLER

BACKGROUND OF THE INVENTION

1. Field of the Invention

This invention relates to power amplifier systems.

2. Description of the Related Art

RF power amplifiers (PA's) are widely used in the transmitter section of radio transceivers, such as in cellular phones and data cards used with mobile computing devices. The PA provides the last amplification stage for the RF signal being transmitted by the antenna.

In cellular telephone systems, the power delivered by the PA and consequently transmitted by the antenna is typically controlled in a closed loop fashion, where the basestation commands the mobile device to transmit at a proper power level in order to maintain a good communication link to the basestation. As the mobile moves farther away from the basestation, the basestation commands the mobile device to increase its transmit power until a maximum transmit power limit is reached as determined by the mobile device. This maximum transmit power is determined by regulatory standards such as the 3 Gpp TS 25.101. Further limits may be placed on maximum transmit power by safety considerations, based on human body Specific Absorption Rate (SAR) of the RF signal radiated from the antenna of the mobile device. Further, the mobile device may reduce the maximum transmit power if the PA cannot meet transmit adjacent channel leakage limit specifications as required by standards such as 3 Gpp TS 25.101. Such power reduction may be required if challenging peak to average (PAR) in the modulation, impedance mismatch conditions at the antenna (due to the antenna being placed in proximity to a metal surface, for example), temperature changes or other factors cause the PA to operate in a nonlinear mode, resulting in distortion which generates adjacent channel leakage. Finally, it may be prudent to monitor and limit the maximum current drawn from the PA, since for some impedance mismatch angles at the antenna, the PA may draw excessive current, stressing the PA or reducing battery life of the mobile device. Nonetheless, it is still desirable to maximize the mobile's transmit power in order to provide the best possible coverage range and data rates, since often the limiting factor for cellular "dead zones" and low data rates is the mobile device's maximum transmit power capability when at the edge of the cell of mobile phones. An increase in power of just 1 dB can make a difference in coverage area of 14% or more.

FIG. 1 is a block diagram illustrating a conventional RF PA system that monitors and adjusts the PA's transmit power. The PA system includes a transmitter IC (TXIC) 102, a transmit (TX) filter 111, a power amplifier (PA) 104, and a directional coupler 112. PA 104 under supply voltage bias 108 receives RF input signal 106 from TXIC 102, and amplifies it to generate RF output signal 110. The power delivered by the PA 104 at RF output signal 110 is controlled by a TXIC 102 which feeds a composite signal (including at least amplitude modulation information and, phase modulation information and/or frequency modulation information) 106 to the input 107 of the PA 104. TXIC 102 has a variable drive circuit, with the capability to vary the drive level to the input 107 of PA 104, typically by adjusting the gain of an internal drive amplifier 114 and/or adjusting the levels of the RF input signal fed to internal drive amplifier 114. By adjusting the drive level to the input 107 of the PA 104, the RF power level at the output 110 of PA 104 is thereby controlled, and thus the transmitted power is controlled at the antenna (not shown). As mentioned previously, in a typical cellular system (such as WCDMA), the basestation provides commands to each mobile phone to control its transmitted power. A table of values correlating the drive level at TXIC output 106 to the radiated power at the antenna or antenna connector (not shown) is typically maintained by the TXIC 102. The TXIC 102 uses such correlated values to generate the proper drive level at TXIC output 106 in response to such commands received from the basestation. Note that the output 106 of TXIC 102 may feed an interstage TX filter 111 prior to driving PA 107, to reduce spurious noise.

As the mobile device's maximum transmit power capability is reached, the mobile device must limit the transmit power as described earlier. The TXIC 102 may sense the forward coupled power 113 of the RF output signal 110 output from PA 104 using directional coupler 112, and thus estimate the RF power of the RF output signal 115 fed towards the antenna of the mobile device. In this way, a more accurate estimate of transmit power can be made than with the table of values which set drive levels at the TXIC output 106 as mentioned previously. A loop may be formed with TXIC 102 adjusting the drive level at output 106 using its internal drive amplifier 114 based on the forward power 113 sensed at the forward coupled port of direction coupler 112. The conventional RF PA system of FIG. 1 has the advantage of eliminating errors in the transmit power level of the RF signal 115 due to gain variations in PA 104 as well as in TXIC 102.

However, the conventional RF PA system typically cannot accurately limit the maximum transmit power of the RF output signal 115 based on the criteria mentioned earlier. For example, when the PA 104 drives a load (not shown) at an unexpected impedance due to an impedance mismatch at the antenna, increased adjacent channel leakage typically occurs. Under these conditions, the power delivered by PA 104 towards the antenna naturally decreases due to mismatch loss, which helps to mitigate the adjacent channel leakage. However, TXIC 102 will sense forward power 113 at directional coupler 112 which is somewhat unpredicted, due to the directional coupler's lack of 50 Ohms operating environment. At some impedance mismatch angles, the feedback loop including internal drive amplifier 114 tends to adjust the output drive 106 of TXIC 102 to reduce the PA output power 110 excessively. The mobile device's maximum transmit power is thus reduced beyond what is needed, detrimentally affecting mobile phone coverage and data rates. Additionally, the feedback loop operates at a slow rate, since the forward power 113 of the RF signal detected at directional coupler 112 must be heavily averaged to accurately assess the forward power level, causing a large delay in adjustment of the mobile device's maximum transmit power level, during which time the mobile device's maximum transmit power is not optimized. Other factors such as temperature and current drawn by the PA 104 are neither monitored nor estimated, and thus the TXIC 102 may assume the worst case with a tendency towards reducing the PA output power 110 excessively. Finally, the actual power loss caused by various additional components (not shown) between PA 104 and the antenna are not taken into account in adjusting the PA output power 110, and are typically merely estimated, again resulting in suboptimal power control of the PA maximum power.

SUMMARY OF THE INVENTION

Embodiments of the present invention include a power amplifier system that is configured to adjust the gain of a power amplifier based on one or more sensed operating conditions of the power amplifier while maintaining substantially constant a level of the input signal to the power amplifier. A power amplifier power controller in the power amplifier system monitors various operating conditions of the power amplifier, and controls the output transmit power by coordinated control of both the input drive to the power amplifier and the gain of the power amplifier. Thus, the transmit power is maximized within the constraints of the operating conditions. The power amplifier power controller receives the monitored operating conditions of the power amplifier, and then controls the input drive level to the power amplifier so that the input drive level does not change while adjusting the gain of the power amplifier to maximize the transmit power. Thus, the power amplifier power controller may be added to the power amplifier system without interfering with the normal operation of the power amplifier system.

In one embodiment, the power amplifier power controller monitors the impedance mismatch at the output of the power amplifier and adjusts the gain of the power amplifier based on the monitored impedance mismatch, including the degree of the impedance mismatch and/or the angle of the impedance mismatch. In one embodiment, the degree of impedance mismatch is determined according to the ratio of reverse power to forward power sensed at the output of the power amplifier. In another embodiment, the angle of impedance mismatch is determined according to the phase difference between reverse power and forward power sensed at the output of the power amplifier. In still other embodiments, the power amplifier controller adjusts the gain of the power amplifier further based on one or more sensed conditions of the power amplifier, such as the temperature at which the power amplifier system operates, antenna conditions, and the current of the power amplifier.

In another embodiment, the power amplifier power controller may adjust the input drive level by some portion of the overall change required to the power of the power amplifier rather than maintaining the input drive level constant, while adjusting the gain of the power amplifier by the remaining portion of the overall change required to the power of the power amplifier. As a result, less gain adjustment range is required in the power amplifier The power amplifier system according to the embodiments herein has the advantage that it can locally monitor the operating conditions of the power amplifier and respond by autonomously and rapidly optimizing the maximum transmit power of the power amplifier by adjusting the gain of the power amplifier while maintaining substantially constant the input drive level to the power amplifier. Thus, the power amplifier controller can be added to existing TXIC systems without interfering with their operation.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the present invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

At a high level, a power amplifier power controller in a power amplifier system monitors various operating conditions of the power amplifier, and controls the output transmit power by coordinated control of both the input drive to the power amplifier and the gain of the power amplifier. The power amplifier power controller adjusts the gain of the power amplifier based on one or more of the sensed operating conditions of the power amplifier while maintaining substantially constant the level of the input signal to the power amplifier. Thus, the transmit power of the power amplifier can be maximized within the constraints of the operating conditions.

Figure 1:
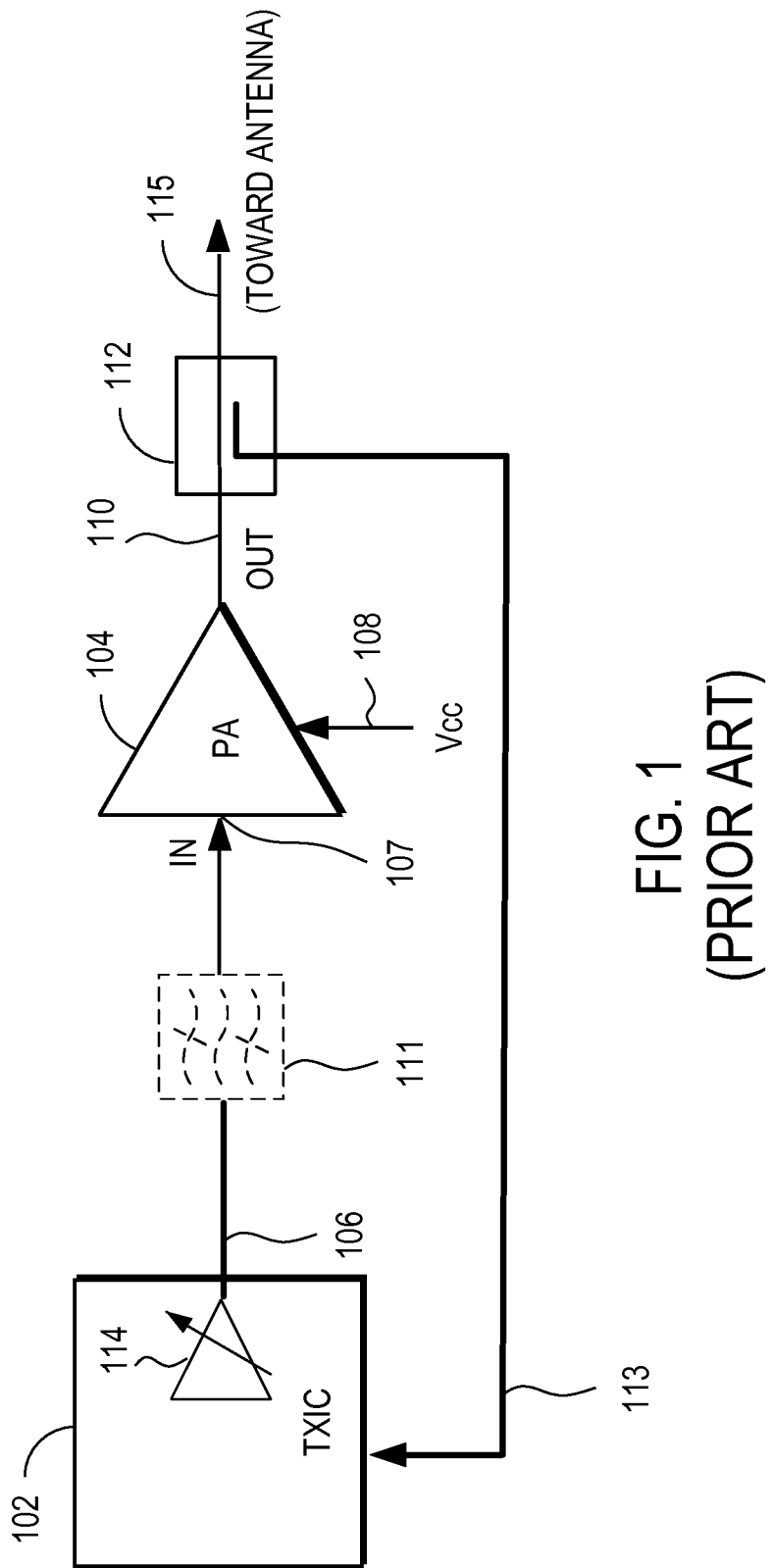
FIG. 1 is a block diagram illustrating a conventional RF PA system that monitors and adjusts the PA's transmit power
Figure 2:
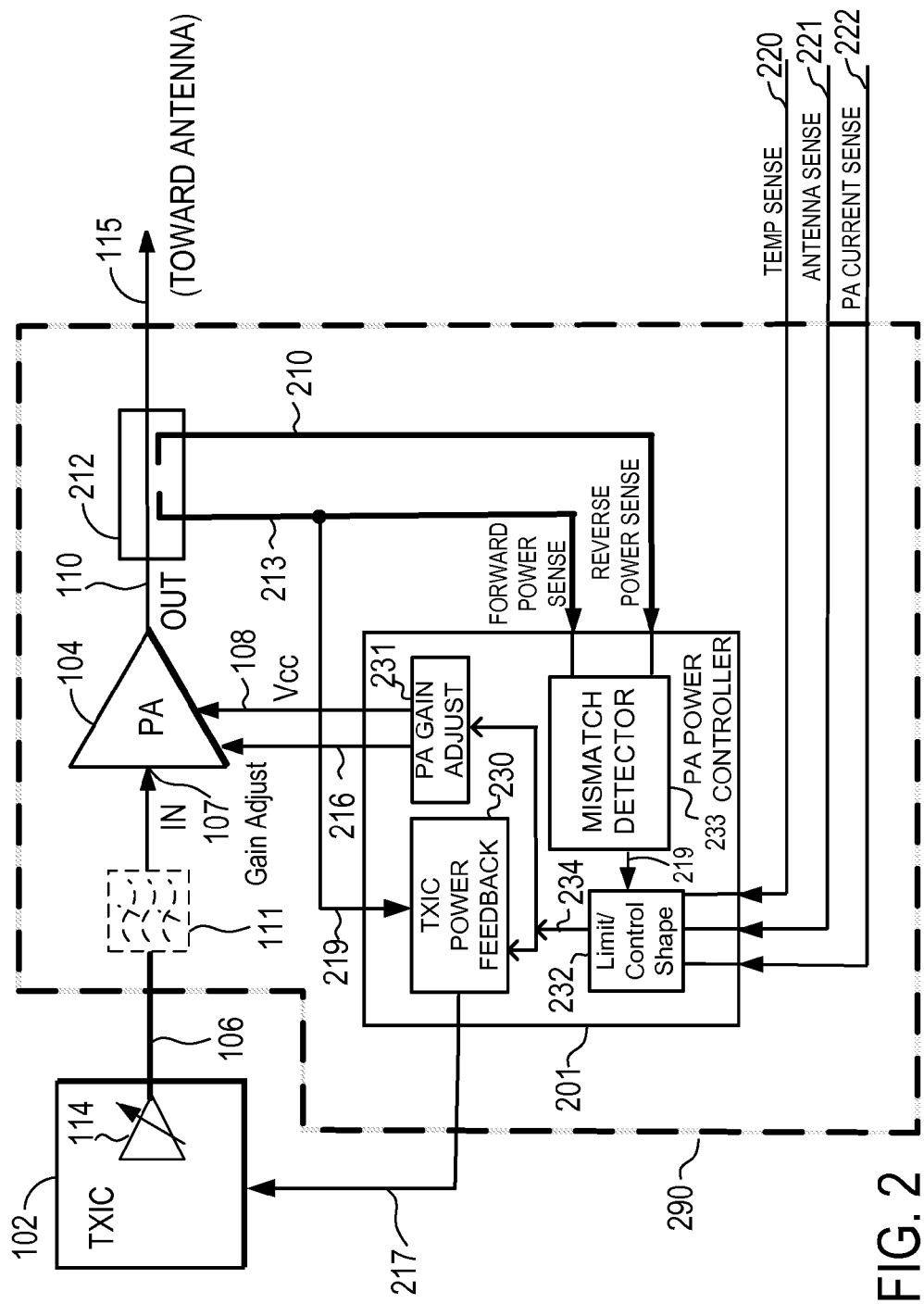
FIG. 2 is a block diagram illustrating a RF PA system that monitors and adjusts the PA's transmit power, according to one embodiment.

Turning to the figures, FIG. 2 is a block diagram illustrating a RF PA system that monitors and adjusts the PA's transmit power, according to one embodiment. The RF PA system includes a transmitter IC (TXIC) 102, an optional transmit (TX) filter 111, a power amplifier (PA) 104, a directional coupler 212, and a PA power controller 201. PA 104 receives a composite RF input signal (including at least amplitude modulation information and, phase modulation information and/or frequency modulation information) 106 from TXIC 102, and amplifies it to generate RF output signal 110. TXIC 102 has the capability to vary the drive level to the input 107 of PA 104, typically by adjusting the gain of an internal drive amplifier 114 and/or adjusting the levels of the RF input signal fed to internal drive amplifier 114. PA power controller 201 may be a separate IC die, or may be integrated together with PA 104. For example, PA power controller 201 may be contained with a PA module whose functional boundaries are depicted by reference numeral 290.

PA power controller 201 includes an impedance mismatch detector 233, a limit/control shape module 232, a TXIC power feedback module 230, and a PA gain adjust module 231. The PA power controller 201 monitors various PA conditions, such as forward power 213 of the RF output signal 110, reverse power 210 of the RF output signal 110, temperature 220, antenna conditions 221, and/or PA current 222. Forward power 213 and reverse power 210 may be sensed using directional coupler 212. Temperature 220 may be sensed with a thermistor (not shown) placed in proximity to PA 104. Antenna conditions 221 include conditions such as whether or not the antenna is placed near a metal surface, whether the antenna of the mobile device is in an extended position, SAR (Specific Absorption Rate) conditions, and other operating conditions of the antenna. Antenna conditions 221 may be sensed utilizing impedance mismatch detector 233, or by an additional directional coupler (not shown) near the antenna, which provides sensing of forward and reverse power that varies in response to such antenna conditions. PA current 222 may be sensed by measuring the voltage across a low value sense resistor (not shown) in series with the power supply line 108 of PA 104. In one embodiment, PA current 222 is the current consumed by PA 104.

Mismatch detector 233 monitors impedance mismatch conditions as seen at the output of PA 104. Impedance mismatch conditions can be monitored by use of directional coupler 212. Forward coupled signal 213 and reverse coupled signal 210 from directional coupler 212 are sensed by mismatch detector 233, which determines the degree of impedance mismatch and optionally the angle of impedance mismatch between the forward power 213 and reverse power 210 at the output 110 of PA 104. Mismatch detector 233 passes the impedance mismatch signal 219 indicating such degree and/or the angle of impedance mismatch to limit/control shape block 232. Limit/control shape block 232 receives the impedance mismatch signal 219 as well as the signals indicating the sensed temperature 220, antenna conditions 221, and the PA current 222, and generates a control signal 234 that is used to control the TXIC power feedback block 230 and the PA gain adjust block 231. Limit/control shape block 232 may be programmable and includes (i) limit detectors which set a threshold for the applied sense inputs, below which PA gain and TXIC output feedback levels are to be adjusted, and (ii) control and shaping functions, which apportion sensor-to-control gain and frequency response to the signals 234 feeding TXIC power feedback module 230 and PA gain adjust module 231. For example, limit/control shape block 232 may include one or more comparators (not shown) which compare the level of mismatch 219 reported by mismatch detector 233, the sensed temperature 220, the sensed antenna conditions 221, and/or the sensed PA current 222, to one or more predetermined thresholds. Limit/control shape block 232 may also include one or more analog-to-digital (A/D) converters (not shown), which digitize the above mentioned sensed condition signals and, with the aid of a multidimensional digital lookup table, yield a digital output determining the degree of PA gain and TXIC output power feedback adjustment required. Digital or analog filters (not shown) may smooth the response of above mentioned signals 219, 220, 221, 222. The values in the digital lookup table may be generated by empirically observing the linearity performance and internal die temperature of PA 104 under various conditions as reported by signals 219, 220, 221, 222. A digital-to-analog (D/A) converter (not shown) may be utilized to convert such digital output to analog form, to generate signal 234, which ultimately represents the degree of PA gain and TXIC power feedback adjustment required.

Based on control signal 234, the PA gain adjust module 231 adjusts the gain 216 or supply voltage bias 108 of PA 104, in order to optimize the maximum transmit power level of the RF PA system. For example, when excessive PA current 222 is sensed, PA power controller 201 lowers the gain 216 of PA 104 in order to reduce the PA output power to safe levels.

In addition to adjusting the gain of PA 104, TXIC power feedback module 230 concurrently sends a control signal 217 to TXIC 102 in order to control the drive level at TXIC output 106 to PA 104. This is beneficial because, for example, TXIC 102 may have originally been configured to include a feedback loop that adjusts the output drive 106 of TXIC 102 using internal drive amplifier 114 based on the sensed forward power 213 from directional coupler 212. In such a feedback loop, an estimate of the RF power 115 fed towards the antenna can be made, and the output drive 106 of TXIC 102 may be adjusted to drive the input 107 of PA 104 to target a desired maximum transmit power. However, consider an example where excessive PA current 222 is detected by PA power controller 201, and in response, the PA power controller 201 aims to reduce the output PA power 115. If PA power controller 201 were to merely reduce the gain of PA 104 and TXIC 102 were allowed to operate independently as described above (with a direct connection to the sensed forward power 213 used as a means of assessing forward power), then the reduced forward power 213 sensed by TXIC 102 will cause the TXIC feedback loop to increase the output drive 106 of TXIC 102 using internal drive amplifier 114 and thus work against the transmit power reduction made by PA gain adjust module 231. This will effectively inhibit the operation of the PA power controller 201 to reduce the gain 216 of PA 104. Thus, in order to prevent such inhibiting operation by TXIC 102, the TXIC power feedback module 230 commands TXIC 102 to keep substantially constant the drive level at TXIC output 106 via control line 217 despite sensing forward power 213, while PA gain adjust module 231 reduces the gain 216 of PA 104. In other systems, the TXIC 102 may operate differently, but nonetheless is controlled via control signal 217 in order for the PA power controller 201 to correctly control the transmit power by a combination of the drive level at the input 107 of PA 104 and gain adjustment of PA 104.

In another embodiment, TXIC 102 may not keep constant the drive level at TXIC output 106, but rather operate with some variation of the drive level at output 106, in response to control signal 217 from PA power controller 201. For example, control line 217 may provide a signal indicating to TXIC 102 that PA power controller 201 has sensed a condition which warrants a change in the output PA power 115, and thus the control to change output PA power 115 may be shared between PA gain adjust module 231 and TXIC 102. In this case, TXIC 102 may adjust the drive level at TXIC output 106 by some portion of the overall change required to PA power 115, while PA gain adjust module 231 adjusts the PA gain 216 by the remaining portion of the required change to PA power 115. As a result, less gain adjustment range is required in the PA 104.

In the example shown in FIG. 2, the PA gain may be adjusted either with a gain adjust control signal 216, which adjusts a bias control or variable gain amplifier (VGA) within PA 104 to change its gain, and/or by adjusting a supply voltage bias VCC 108, which is another means of adjusting the PA gain. Any other means of adjusting the gain within the PA module boundary 290 can be used with the embodiments described herein.

Figure 3:
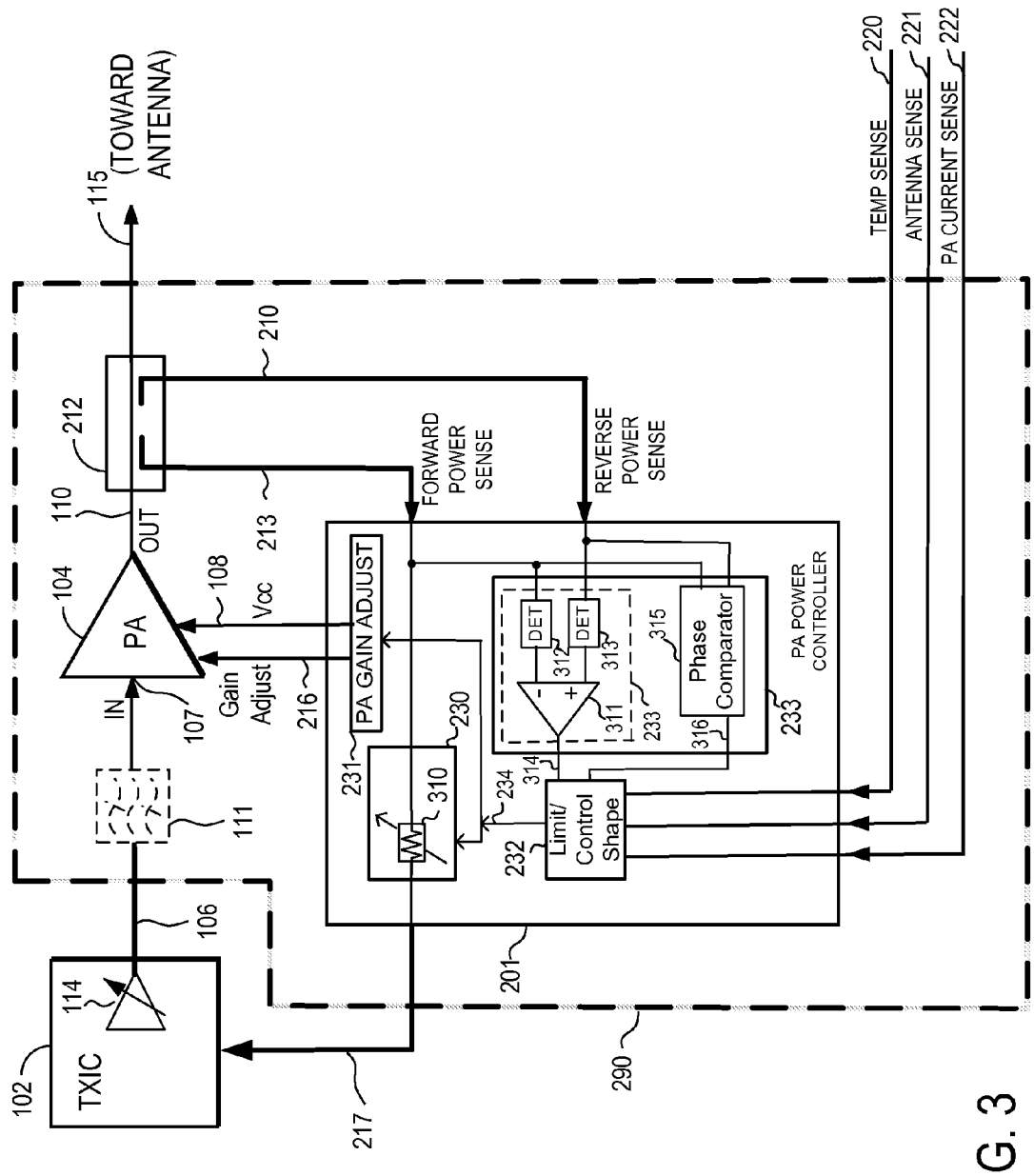
FIG. 3 is a block diagram illustrating the PA power controller of the RF PA system of FIG. 2 in more detail, according to one embodiment.

FIG. 3 is a block diagram illustrating the PA power controller of the RF PA system of FIG. 2 in more detail, according to one embodiment. Specifically, mismatch detector 233 is shown as including detectors 312 and 313, a differential amplifier 311, and a phase comparator 315. Also, TXIC power feedback module 230 is shown as including a variable attenuator 310. Detectors 312, 313 detect the forward power 213 and the reverse power 210, respectively, sensed from directional coupler 212. In one embodiment, detectors 312 and 313 may be diode-based RF power detectors with a fast response capable of tracking the amplitude modulation on the forward and reverse power ports 213 and 210, and may provide a log response. Differential amplifier 311 amplifies the difference of logarithms between the detected forward power 213 and the reverse power 210 of the RF output signal 110 and feeds this difference signal 314 into limit/control shape block 232. The limit/control shape block 232 may low-pass filter the difference signal 314 output from differential amplifier 311. The resulting signal represents the ratio of reverse power 213 to forward power 210 sensed by directional coupler 212, and thus accurately estimates the degree of impedance mismatch as seen by PA 104 at its output 110. Further, since detectors 312 and 313 are fast and the amplitude modulation detectors 312 and 313 differ only in amplitude, a rapid assessment of impedance mismatch can be made. A rapid assessment of impedance mismatch is beneficial because it enables the PA power controller 201 to quickly optimize the maximum transmit power of PA 104, minimizing coverage loss during bursty operation. Bursty operation can occur, for example, when the mobile device is transmitting data in bursts. A slow optimization of maximum transmit power of PA 104 can cause entire bursts to be lost when operating near the cell edge, as the power may be either too low to reach the basestation, or too high and cause the transmitted signal to be distorted.

As described previously, limit/control shape block 232 may be programmable and include limit detectors which set a threshold for the applied sense inputs, below which PA gain and TXIC output power levels are to be adjusted. In the case of the mismatch detector 233, in one embodiment a threshold of a ratio of 1:10 in reverse to forward power levels detected at detectors 313 and 312, respectively, may be a reasonable threshold above which the impedance mismatch is sufficient to cause linearity to degrade in PA 104 and cause unacceptable adjacent channel leakage. Thus, above this threshold of 1:10, limit/control shape block 232 causes PA gain adjust module 231 to send a signal 216 to reduce the PA gain. The amount of PA gain reduction may be programmable, but is optimized to limit the gain reduction to that which is necessary to reduce adjacent channel leakage of the mobile device to acceptable levels.

The amount of gain reduction applied may also be dependent on the angle of mismatch between the forward power 213 and the reverse power 210, which may be measured by phase comparator 315. Specifically, phase comparator 315 measures the phase difference between forward power 213 and reverse power 210, and generates phase difference signal 316 representing such phase difference. With this additional feature, limit/control shape block 232 receives such phase difference signal 316 and is programmed to cause PA gain adjust module 231 to send control signal 216 to reduce the gain of PA 104 based on a combination of the signal 314 output from differential comparator 311 representing the reverse-to-forward power levels and the signal 316 output from phase comparator 315 representing the phase difference between the forward power 213 and the reverse power 210. Since the degree of gain reduction of the PA 104 needed to reduce adjacent channel leakage may be dependent on the angle 316 of mismatch, a more finely optimized maximum transmit power can be achieved in the PA system of FIG. 3.

As described previously, limit/control shape block 232 controls TXIC power feedback module 230 in combination with PA gain adjust module 231 to adjust and optimize the maximum transmit power levels of the PA 104. In this example, variable attenuator 310 in TXIC power feedback module 230 is placed in series with the forward power sense line 213 which is typically part of the TXIC transmit power loop as earlier described. In response to the sensed forward power 213, TXIC power feedback module 230 causes variable attenuator 310 to reduce the amount of attenuation of the forward power 213 by approximately the same amount as PA gain adjust module 231 decreases the gain of PA 104, and vice versa. On the other hand, TXIC power feedback module 230 causes variable attenuator 310 to increase the amount of attenuation of the forward power 213 by approximately the same amount as PA gain adjust module 231 increases the gain of PA 104. Thus, the power level at control signal line 217, sensed by TXIC 102, remains substantially constant, and so does not induce TXIC 102 to change its drive level at output 106 despite PA gain adjust module 231 adjusting the gain of PA 104. In this manner, the TXIC transmit power loop is prevented from interfering with the transmit power optimization performed by PA power controller 201.

As described previously, in another embodiment the RF PA system may be optimized in such a way that TXIC 102 may not keep constant the drive level at TXIC output 106, but rather operate with some variation of the drive level, in response to control signal 217 from TXIC power feedback module 230. For example, TXIC power feedback module 230 may cause variable attenuator 310 to reduce the amount of attenuation of the forward power 213 by more than the amount that PA gain adjust module 231 decreases the gain 216 of PA 104, and vice versa. On the other hand, TXIC power feedback module 230 may cause variable attenuator 310 to increase the amount of attenuation of the forward power 213 by more than the amount that PA gain adjust module 231 increases the gain 216 of PA 104. Thus, the power level at control signal line 217, sensed by TXIC 102, may change in a way which induces TXIC 102 to change its drive level at output 106 in concert with PA gain adjust module 231 adjusting the gain of PA 104. In this manner, the TXIC 102 drive level at output 106 and the change of gain of PA 104 both contribute to the overall change required to PA power 115. The benefit of such a system is that less PA gain adjustment range is required.

The PA power controller 201 may also estimate SAR conditions, and limit the transmitted power when a predetermined SAR limit is exceeded. When the antenna is placed in proximity to the human body, the degree of reflected power may increase. Thus, mismatch detector 233 may be employed to detect SAR. In one embodiment, a threshold of a ratio of reverse to forward power levels detected at detectors 313 and 312, respectively, is predetermined to be a reasonable threshold above which SAR may be exceeded. Thus, when the detected SAR is above this threshold, limit/control shape block 232 may cause PA gain adjust module 231 to send a signal 216 to reduce the gain of the PA 104. The amount of PA gain reduction may be programmable, and further may differ depending on whether the mobile device is in "data tether" mode or "voice" mode. In "data tether" mode, the speaker and the microphone of the mobile device are disabled, and thus the user will not be operating the mobile device in proximity to the head, permitting a lesser PA gain reduction.

According to various embodiments of the present invention, the PA power controller can monitor various operating conditions of the PA, and responds by autonomously and rapidly optimizing the maximum transmit power of the PA. At the same time, the TXIC output power level fed to the PA is maintained substantially constant, so that the TXIC does not interfere with the operation of the PA power controller.

Upon reading this disclosure, those of skill in the art will appreciate still additional alternative designs possible for a PA power control system. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the present invention.

What is claimed is:

1. A power amplifier system, comprising:
   a power amplifier configured to receive and amplify an RF input signal including at least amplitude modulation information to generate an RF output signal; and a power amplifier power controller configured to determine an angle of impedance mismatch at an output of the power amplifier according to a phase difference between reverse power and forward power of the RF output signal sensed at the output of the power amplifier and configured to adjust a gain of the power amplifier based on the angle of the impedance mismatch while maintaining substantially constant a level of the RF input signal to the power amplifier.

2. The power amplifier system of claim 1, wherein the power amplifier power controller is configured to adjust the gain of the power amplifier further based on a degree of the impedance mismatch.

3. The power amplifier system of claim 2, wherein the power amplifier power controller determines the degree of impedance mismatch according to a ratio of the reverse power to the forward power of the RF output signal sensed at the output of the power amplifier.

4. The power amplifier system of claim 1, further comprising an input controller configured to provide the RF input signal to the power amplifier, the power amplifier power controller controlling the input controller to maintain substantially constant the level of the RF input signal provided to the power amplifier while adjusting the gain of the power amplifier.

5. The power amplifier system of claim 4, wherein the input controller includes a variable drive circuit configured to adjust the level of the RF input signal provided to the power amplifier responsive to an input drive control signal received from the power amplifier power controller.

6. The power amplifier system of claim 5, wherein the power amplifier power controller includes a variable attenuator configured to attenuate a sensed forward power level of the RF output signal to be provided as the input drive control signal to the variable drive circuit, the power amplifier power controller configured to reduce or increase attenuation of the sensed forward power level as the gain of the power amplifier is reduced or increased, respectively, so as to maintain substantially constant the level of the RF input signal provided to the power amplifier.

7. The power amplifier system of claim 1, wherein the power amplifier power controller is configured to adjust the gain of the power amplifier further based on one or more sensed conditions of the power amplifier.

8. The power amplifier system of claim 7, wherein the sensed conditions include a temperature at which the power amplifier system operates.

9. The power amplifier system of claim 7, wherein the sensed conditions include SAR (Specific Absorption Rate) at which the power amplifier system operates.

10. The power amplifier system of claim 7, wherein the sensed conditions include a condition of an antenna coupled to the power amplifier for transmission of the RF output signal of the power amplifier.

11. The power amplifier system of claim 7, wherein the sensed conditions include current of the power amplifier.

12. A method for controlling a power amplifier system, the method comprising:
receiving and amplifying an RF input signal to a power amplifier to generate an RF output signal, the RF input signal including at least amplitude modulation information;
determining an angle of impedance mismatch at an output of the power amplifier according to a phase difference between reverse power and forward power of the RF output signal sensed at the output of the power amplifier; and adjusting a gain of the power amplifier based on the angle of the impedance mismatch while maintaining substantially constant a level of the RF input signal to the power amplifier.

13. The method of claim 12, wherein the gain of the power amplifier is adjusted further based on a degree of the impedance mismatch.

14. The method of claim 13, wherein the degree of impedance mismatch is determined according to a ratio of the reverse power to the forward power of the RF output signal sensed at the output of the power amplifier.

15. The method of claim 12, further comprising reducing or increasing attenuation of a sensed forward power level of the RF output signal of the power amplifier to be provided to an input drive controller providing the RF input signal to the power amplifier as the gain of the power amplifier is reduced or increased, respectively, so as to maintain substantially constant the level of the RF input signal to the power amplifier.

16. The method of claim 12, wherein the gain of the power amplifier is adjusted further based on one or more sensed conditions of the power amplifier.

17. The method of claim 16, wherein the sensed conditions include a temperature at which the power amplifier system operates.

18. The method of claim 16, wherein the sensed conditions include SAR (Specific Absorption Rate) at which the power amplifier system operates.

19. The method of claim 16, wherein the sensed conditions include a condition of an antenna coupled to the power amplifier for transmission of the RF output signal of the power amplifier.

20. The method of claim 16, wherein the sensed conditions include current of the power amplifier.

21. A power amplifier system, comprising:
a power amplifier configured to receive and amplify an RF input signal including at least amplitude modulation information to generate an RF output signal;
a power amplifier power controller configured to adjust a gain of the power amplifier based upon one or more sensed conditions of the power amplifier; and
an input controller configured to provide the RF input signal to the power amplifier, the input controller including a variable drive circuit configured to adjust the level of the RF input signal provided to the power amplifier responsive to an input drive control signal received from the power amplifier power controller, wherein:
the power amplifier power controller is configured to reduce or increase attenuation of a sensed forward power level of the RF output signal to be provided as the input drive control signal while reducing or increasing the gain of the power amplifier, respectively, so as to maintain substantially constant the level of the RF input signal provided to the power amplifier, and
the power amplifier power controller includes an impedance mismatch detector configured to determine an angle of impedance mismatch at the output of the power amplifier according to a phase difference between reverse power and forward power of the RF output signal sensed at the output of the power amplifier, the power amplifier power controller configured to adjust the gain of the power amplifier further based on the angle of the impedance mismatch while maintaining substantially constant the level of the RF input signal provided to the power amplifier.

22. The power amplifier system of claim 21, wherein the power amplifier power controller includes a variable attenuator configured to attenuate the sensed forward power level of the RF output signal.

23. The power amplifier system of claim 21, wherein the power amplifier power controller is configured to adjust the gain of the power amplifier further based on a degree of the impedance mismatch.

24. The power amplifier system of claim 23, wherein the power amplifier power controller determines the degree of impedance mismatch according to a ratio of the reverse power to the forward power of the RF output signal sensed at the output of the power amplifier.

25. The power amplifier system of claim 21, wherein the sensed conditions include a temperature at which the power amplifier system operates.

26. The power amplifier system of claim 21, wherein the sensed conditions include SAR (Specific Absorption Rate) at which the power amplifier system operates.

27. The power amplifier system of claim 21, wherein the sensed conditions include a condition of an antenna coupled to the power amplifier for transmission of the RF output signal of the power amplifier.

28. The power amplifier system of claim 21, wherein the sensed conditions include current of the power amplifier.

29. A power amplifier system, comprising:
a power amplifier configured to receive and amplify an RF input signal including at least amplitude modulation information to generate an RF output signal;
a power amplifier power controller configured to determine an angle of an impedance mismatch at an output of the power amplifier according to a phase difference between reverse power and forward power of the RF output signal sensed at the output of the power amplifier and configured to adjust a gain of the power amplifier based on the angle of the impedance mismatch; and
an input controller configured to provide the RF input signal to the power amplifier, wherein:
the power amplifier power controller controls the input controller to adjust a level of the RF input signal provided to the power amplifier while adjusting the gain of the power amplifier, the adjustment of the level of the RF input signal being different from a change in output power of the power amplifier.

30. The power amplifier system of claim 29, wherein the input controller includes a variable drive circuit configured to adjust the level of the RF input signal provided to the power amplifier responsive to an input drive control signal received from the power amplifier power controller, the power amplifier power controller being configured to reduce or increase attenuation of a sensed forward power level of the RF output signal to be provided as the input drive control signal by more than an amount of reduction or increase of the gain of the power amplifier, respectively.

31. The power amplifier system of claim 30, wherein the power amplifier power controller includes a variable attenuator configured to attenuate the sensed forward power level of the RF output signal.

* * * * *